(12) United States Patent
Mihara et al.

(10) Patent No.: US 8,067,274 B2
(45) Date of Patent: Nov. 29, 2011

(54) METHOD OF FORMING WIRING ON A PLURALITY OF SEMICONDUCTOR DEVICES FROM A SINGLE METAL PLATE, AND A SEMICONDUCTOR CONSTRUCTION ASSEMBLY FORMED BY THE METHOD

(75) Inventors: Ichiro Mihara, Tachikawa (JP); Takeshi Wakabayashi, Sayama (JP)

(73) Assignee: Casio Computer Co., Ltd., Tokyo (JP)

( * ) Notice: Subject to any disclaimer, the term of this patent is extended or adjusted under 35 U.S.C. 154(b) by 36 days.

(21) Appl. No.: 12/506,503

(22) Filed: Jul. 21, 2009

(65) Prior Publication Data
US 2010/0019383 A1 Jan. 28, 2010

(30) Foreign Application Priority Data
Jul. 22, 2008 (JP) .................................. 2008-188882

(51) Int. Cl.
*H01L 21/00* (2006.01)

(52) U.S. Cl. ........ 438/126; 438/110; 438/111; 438/112; 438/113; 438/121; 438/123; 438/124; 438/125; 438/127

(58) Field of Classification Search .......... 438/110–113, 438/121, 123, 124–127
See application file for complete search history.

(56) References Cited

U.S. PATENT DOCUMENTS

| 7,341,890 B2 * | 3/2008 | Ishimaru et al. | 438/125 |
| 2004/0070064 A1 * | 4/2004 | Yamane et al. | 257/686 |
| 2006/0125082 A1 * | 6/2006 | Wakabayashi et al. | 257/698 |
| 2006/0141669 A1 * | 6/2006 | Wakabayashi et al. | 438/110 |
| 2008/0122087 A1 * | 5/2008 | Jobetto | 257/738 |
| 2008/0197482 A1 * | 8/2008 | Nagamatsu et al. | 257/712 |
| 2008/0203557 A1 * | 8/2008 | Yamamoto et al. | 257/700 |
| 2011/0027945 A1 * | 2/2011 | Saitou et al. | 438/125 |

FOREIGN PATENT DOCUMENTS

| JP | 2004-349361 A | 12/2004 |
| JP | 2007-134738 A | 5/2007 |

* cited by examiner

*Primary Examiner* — Kevin M Picardat
*Assistant Examiner* — Bac Au
(74) *Attorney, Agent, or Firm* — Holtz, Holtz, Goodman & Chick, PC

(57) ABSTRACT

In this manufacturing method of a semiconductor device, a metal plate having a plurality of projection electrodes in each of a plurality of semiconductor device formation areas is prepared. Next, the projection electrodes of each of the semiconductor formation areas are aligned corresponding to external connection electrodes of each semiconductor construction, and each semiconductor construction is separately arranged on the projection electrodes in the semiconductor device formation areas. Next, an insulating layer formation sheet is arranged on the metal plate, and the metal plate and the insulating layer formation sheet are joined by heat pressing. Then, the metal plate is patterned and a plurality of upper layer wirings that connect to the projection electrodes is formed.

7 Claims, 10 Drawing Sheets

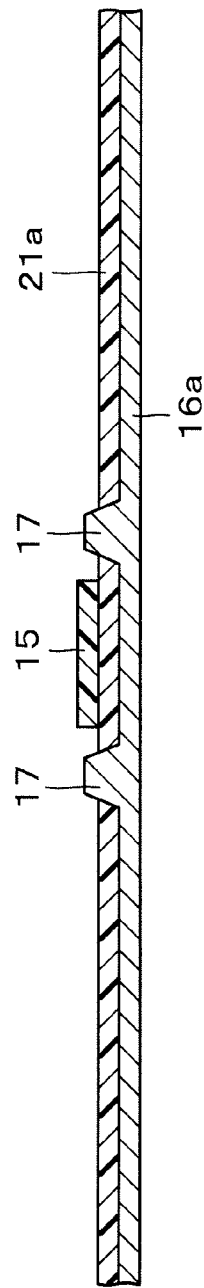
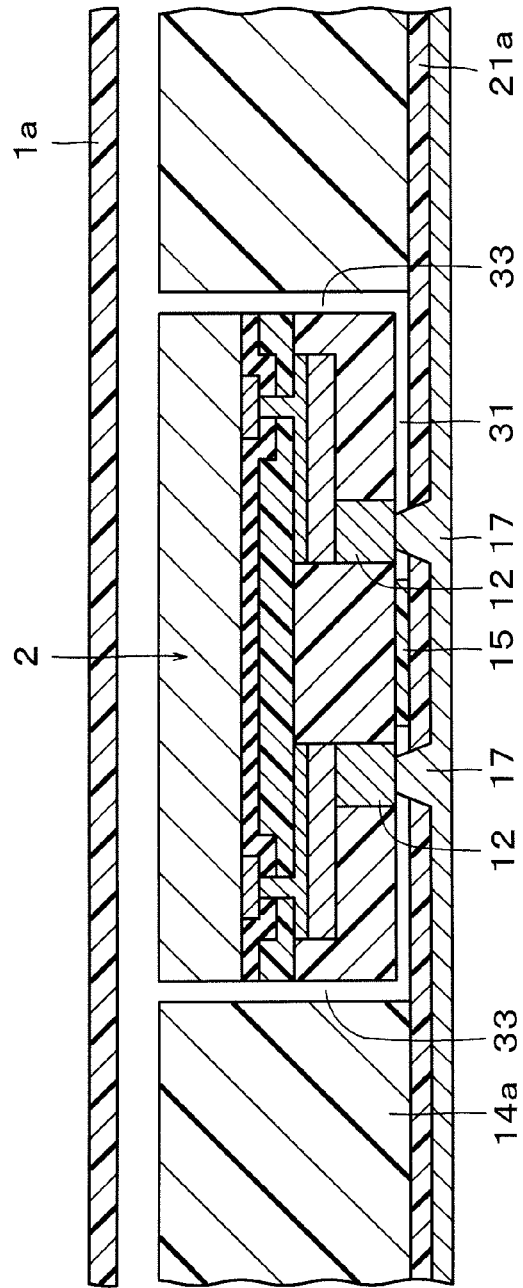

METHOD OF FORMING WIRING ON A PLURALITY OF SEMICONDUCTOR DEVICES FROM A SINGLE METAL PLATE, AND A SEMICONDUCTOR CONSTRUCTION ASSEMBLY FORMED BY THE METHOD

CROSS-REFERENCE TO RELATED APPLICATION

This application is based upon and claims the benefit of priority from the prior Japanese Patent Application No. 2008-188882, filed Jul. 22, 2008, the entire contents of which is incorporated herein by reference.

BACKGROUND OF THE INVENTION

1. Field of the Invention

The present invention relates to a method of forming wiring on a plurality of semiconductor devices from a single metal plate, and a semiconductor construction assembly formed by the method.

2. Description of the Related Art

A conventional semiconductor device is known in which a semiconductor construction is embedded on one surface of a semiconductor substrate, and columnar external connection electrodes are arrayed on the semiconductor construction in matrix form. Generally, a planar area of the semiconductor substrate is small, and thus the number of external connection electrodes that can be arrayed within the area is limited.

For this reason, an insulating film is formed on the periphery of the side surfaces of the semiconductor construction, an upper-layer insulating film is provided on top of the insulating film and the semiconductor construction, and an upper-layer wiring having an external connection pad section is formed on top of the upper-layer insulating film. In this instance, the upper-layer wiring is connected to the external connection electrodes of the semiconductor construction via a contact hole formed in the upper-layer insulating film. When a configuration such as this is applied, an integrated circuit of a larger scale having a large number of external connection electrodes can be miniaturized because the upper-layer insulating film has a greater planar area than the semiconductor construction.

A method described in Japanese Patent Application Laid-Open (Kokai) Publication No. 2007-134738 is known as a manufacturing method of a semiconductor such as described above. In this prior patent document, as shown in FIG. 11 to FIG. 13, a method is described in which a contact hole is formed in the upper-layer insulating film by laser beam irradiation, and after a base metal layer is formed on the overall surface of the upper-layer insulating film including the top surfaces of the columnar external connection electrodes exposed via the contact hole, an upper-layer metal layer is formed by electroplating, and then patterning is performed by a photolithography method to form the upper-layer wiring.

As another method, a method described in Japanese Patent Application Laid-Open (Kokai) Publication No. 2004-349361 is known. In the method described in this prior patent document, manufacturability is further improved. As shown in FIG. 13 to FIG. 15, conical projection electrodes are formed in advance on a metal plate in positions corresponding to connection electrodes, and after the metal plate is heat pressed from above an upper-layer insulating film, and each projection electrode is wedged into the upper-layer insulating film, the tips of the projection electrodes are placed in contact with the surfaces of corresponding columnar external connection electrodes, and then patterning is performed on the metal plate by the photolithography method to form the upper-layer wiring.

However, in the method described in Japanese Patent Application Laid-Open (Kokai) Publication No. 2007-134738, a small-area contact hole is formed on the upper-layer insulating film, and then the upper-layer wiring is formed by electroplating. Therefore, a void (air bubble) is formed within the contact hole, and because of this, a disconnected area is formed or uniform plating thickness is difficult to ensure. That is, there is a problem that highly reliable connection is not ensured with regard to a fine pitch.

Moreover, in the method described in Japanese Patent Application Laid-Open (Kokai) Publication No. 2004-349361, when a large number of semiconductor constructions are arrayed on a base, and the metal plate on which the projection electrodes are formed is heat pressed, each semiconductor construction is displaced differently from each other. That is, there is a problem that, with a single metal plate, alignment between all external connection electrodes on the semiconductor constructions and projection electrodes on the metal plate is difficult, and the yield cannot be improved.

SUMMARY OF THE INVENTION

The object of the present invention is to provide a method of forming wiring on a plurality of semiconductor devices from a single metal plate, and a semiconductor construction assembly formed by the method, in which the reliability of connection between wiring and external connection electrodes is improved, and yield during alignment is improved.

In order to achieve the above-described purpose, in accordance with one aspect of the present invention, there is provided a manufacturing method in which, first, a metal plate having a plurality of projection electrodes in each of a plurality of semiconductor device formation areas is prepared. Next, the projection electrodes of each of the semiconductor formation areas are aligned corresponding to external connection electrodes of each semiconductor construction, and each semiconductor construction is arranged separately on the projection electrodes in the semiconductor device formation areas. Next, an insulating layer formation sheet having openings that accommodate each semiconductor construction is arranged on the metal plate, and the metal plate and the insulating layer formation sheet are joined by being heat pressed. Then, after the metal plate is patterned and a plurality of upper layer wirings that connect to at least one of the projection electrodes is formed, the insulating layer formation sheet is cut, and a plurality of semiconductor devices which contain at least one semiconductor construction is acquired.

In accordance with another aspect of the present invention, there is provided a semiconductor device assembly, comprising: a plurality of semiconductor constructions each including a semiconductor substrate, a plurality of external connection electrodes formed on the semiconductor substrate, and an insulating layer formation sheet arranged on the periphery of the semiconductor substrate. The semiconductor device assembly also comprises a metal plate holding the plurality of semiconductor constructions and having a plurality of semiconductor device formation areas each including a plurality of projection electrodes in contact with each external connection electrode of each semiconductor construction. Furthermore, the semiconductor device assembly comprises an insulating layer formation sheet including organic resin which has openings that accommodate each semiconductor construction, and which is arranged between the plurality of semiconductor constructions on the metal plate. In addition, the semiconductor constructions and opposing areas on the metal plate are joined by the same organic resin included in the insulating layer formation sheet that fills gaps between the metal plate and the semiconductor constructions formed by the projecting electrodes.

According to the present invention, a metal plate having a plurality of projection electrodes in each of a plurality of semiconductor device formation areas is prepared, and each external connection electrode of each semiconductor construction is individually placed on the projection electrode in the semiconductor device formation area. Therefore, connection between each projection electrode and each external connection electrode is ensured, thereby improving reliability. Moreover, accurate alignment between each projection electrode and each external connection electrode is ensured, thereby improving yield.

In addition, the present invention includes a plurality of semiconductor constructions each including a plurality of external connection electrodes and an insulating layer arranged on the periphery of a semiconductor substrate, and includes a metal plate, which holds the plurality of semiconductor constructions, having a plurality of semiconductor device formation areas each including projection electrodes in contact with each external connection electrode of each semiconductor construction. Therefore, connection between each projection electrode and each external connection electrode is ensured, thereby improving reliability. Moreover, accurate alignment between each projection electrode and each external connection electrode is ensured, thereby improving yield.

The above and further novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 2A to FIG. 2C are cross-sectional views of procedures in an example of a manufacturing method of the semiconductor device shown in FIG. 1, in which FIG. 2A is a cross-sectional view of an initial procedure, FIG. 2B is a cross-sectional view of a procedure subsequent to that in FIG. 2A, and FIG. 2C is a cross-sectional view of a procedure subsequent to that in FIG. 2B;

FIG. 10A is a cross-sectional view explaining a predetermined procedure of the semiconductor device shown in FIG. 9; and FIG. 10B is a cross-sectional view explaining a procedure subsequent to that in FIG. 10A.

DETAILED DESCRIPTION OF THE PREFERRED EMBODIMENTS

The present invention will hereinafter be described in detail with reference to the preferred embodiments shown in the accompanying drawings.

First Embodiment

Figure 1:
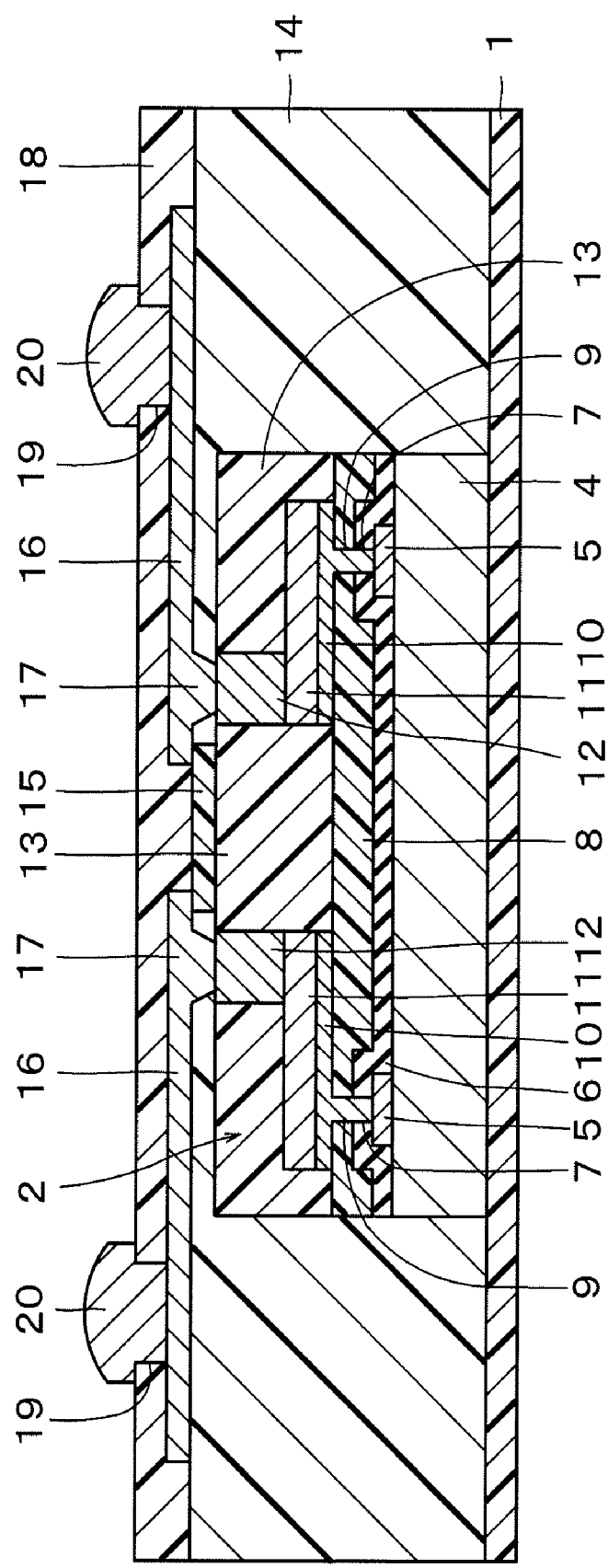
FIG. 1 is a cross-sectional view of a semiconductor device according to the first embodiment of the present invention.

FIG. 1 is a cross-sectional view of a semiconductor device according to the first embodiment of the present invention. The semiconductor device includes a lower-layer insulating film 1 of flat square shape made of epoxy system resin, polyimide system resin, glass cloth base material epoxy resin, and the like. A semiconductor construction 2 is connected to the center of the top surface of this lower-layer insulating film 1. In this instance, the plane size of the lower-layer insulating film 1 is greater than the plane size of the semiconductor construction 2.

The semiconductor construction 2 includes a silicon substrate (semiconductor substrate) 4 of plane rectangle shape. An integrated circuit (not shown) providing a predetermined function is provided on the top surface of this silicon substrate 4. A plurality of connection pads 5 connected to the integrated circuit are formed on the top surface periphery of the semiconductor substrate 4. In actuality, numerous connection pads 5 are arrayed along a pair of opposing sides or along all four sides of the semiconductor substrate 4. However, only two connection pads 5 are shown to simplify the explanation. An insulating film 6 made of silicon oxide and the like is provided on the top surface of the silicon substrate 4 excluding the centers of the connection pads 5. The centers of the connection pads 5 are exposed via openings 7 provided in the insulating film 6.

A protective film (insulating film) 8 made of epoxy system resin, polyimide system resin, and the like is provided on the top surface of the insulating film 6. In this instance, openings 9 are formed in the protective film 8 at sections corresponding to the openings 7 in the insulating film 6. A base metal layer 10 is provided from the top surface of the connection pads 5, which is exposed through the openings 7 and 9, to a predetermined area on the top surface of the protective film 8. An upper-layer wiring 11 made of copper is provided on the entire top surface of the base metal layer 10.

Columnar electrodes (external connection electrodes) 12 made of copper are provided on the top surface of connection pad sections of the upper-layer wiring 11. The columnar electrodes 12 are arrayed on the protective film 8 in matrix form or lattice form. However, as in the case of the connection pads 5, only two columnar electrodes 12 are shown. A sealing film (insulating film) 13 made of epoxy system resin, polyimide system resin, and the like is provided on the top surface of the protective film 8 including the upper-layer wiring 11, such that the top surface of the sealing film 13 is flush with the top surface of the columnar electrodes 12. In this manner, the semiconductor construction 2 includes the silicon substrate 4, the connection pads 5, the insulating film 6, the protective film 8, the base metal layer 10, the upper-layer wiring 11, the columnar electrodes 12, and the sealing film 13.

In an area around the periphery of the semiconductor construction 2 which corresponds to the lower-layer insulating film 1, a insulating film 14 of rectangular frame shape made of thermosetting resin such as epoxy system resin or polyimide system resin is fixed onto the side surfaces of the semiconductor construction 2. In the insulating film 14, a reinforcing material such as glass fiber or glass woven or non-woven fabric is mixed into the resin, and the insulating film 14 covers the semiconductor construction 2. In other words, the top surface of the insulating film 14 is positioned higher than the top surface of the sealing film 13 of the semiconductor construction 2. Although details will be described hereafter, an opening of a size allowing a gap to be present between the semiconductor construction 2 and the insulating film 14 is originally formed in the insulating film 14, and this gap is filled by the insulating film 14 that is melted by a heat pressing process. The peripheral side surfaces and the top surface of the semiconductor construction 2 are fixed by resin that has been melted and subsequently hardened by cooling as described above.

A temporary-fixing adhesive material 15 is formed in the center of the top surface of the sealing film 13 of the semiconductor construction 2. As the adhesive material 15, thermosetting resin such as epoxy system resin, for example, may be used. Alternatively, thermoplastic resin may be used or a sheet-shaped adhesive material may be adhered. A plurality of upper-layer wirings 16 formed by the patterning of a metal plate made of copper and the like are provided on the top surface of the insulating film 14. In this instance, projection electrodes 17 are integrally formed on the bottom surface of each upper-layer wiring 16 in a section corresponding to the center of the top surface of the columnar electrode 12. The projection electrodes 17 have a conical shape that becomes narrower towards the tip end, and the tip end section is a flat surface. The projection electrodes 17 are pressed against the centers of the top surfaces of the columnar electrodes 12 by cohesion that fixes the insulating film 14 to the sealing film 13 of the semiconductor construction 2. Therefore, the projection electrodes 17 and the columnar electrodes 12 are electrically connected with certainty. The tip section of each upper-layer wiring 16 is fixed to the columnar electrode 12 of the semiconductor construction 2 by the adhesive material 15.

An upper-layer insulating film 18 made of solder resist and the like is provided on top of the upper-layer wirings 16 and the insulating film 14. Openings 19 are provided in the upper-layer insulating film 18 in sections corresponding to the connection pad section of each upper-layer wiring 16. A solder ball 20 is provided within and above each opening 19 so as to be connected to the connection pad section of the upper-layer wiring 16.

In the description above, a plurality of solder balls 20 are arrayed on the upper-layer insulating film 18 in matrix form or lattice form. The upper-layer insulating film 18 is significantly larger than the planar area of the semiconductor construction 2, and thus the size and pitch of the connection pad sections of the upper-layer wirings 16 (the sections within the openings 19 in the upper-layer insulating film 18) can be greater than the size and pitch of the columnar electrodes 12. Therefore, when a connection pad section of the semiconductor device is connected to a connection terminal on an external circuit board, joining force can be increased, and reliability of connection can be improved.

Next, an example of a manufacturing method of the semiconductor device will be described. First, the semiconductor construction 2 is prepared in advance. A manufacturing method of the semiconductor construction is described in Japanese Patent Application Laid-Open (Kokai) Publication No. 2004-349361 given as Patent Document 2 above.

Figure 2A:
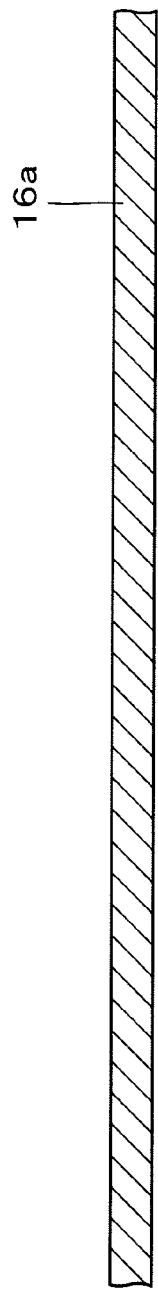
Figure 2B:
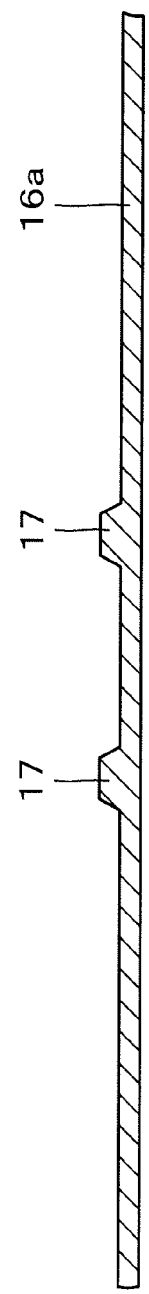
Figure 2C:
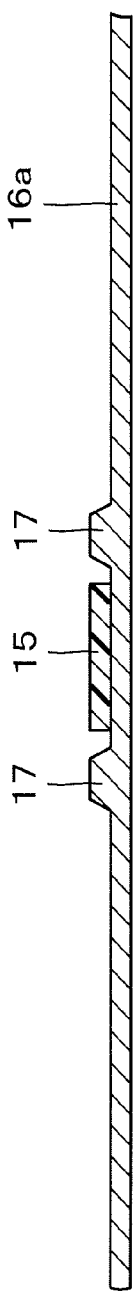

Next, as shown in FIG. 2A, a metal plate 16a made of copper and the like is prepared. This metal plate 16a is of a size including a plurality of semiconductor device formation areas, and the semiconductor device formation area corresponds to the size of the semiconductor device shown in FIG. 1. Next, as shown in FIG. 2B, the projection electrodes 17 are formed by etching in each semiconductor formation area of the metal plate 16a. The projection electrodes 17 are formed in positions corresponding to each columnar electrode 12 of the semiconductor construction 2. Next, as shown in FIG. 2C, the adhesive material 15 is formed in the center of each semiconductor formation area. The adhesive material 15 is formed slightly thicker than the height of the projection electrodes 17, such that the top surface of the adhesive material 15 projects slightly further than the top surfaces of the projection electrodes 17. The adhesive material 15 is formed by screen printing, a coating method, a potting method, transfer, and the like, using liquid thermosetting resin, such as epoxy system resin. Thermoplastic resin may also be used as the adhesive material 15. As another method, a sheet-shaped adhesive material may be adhered.

Figure 3:
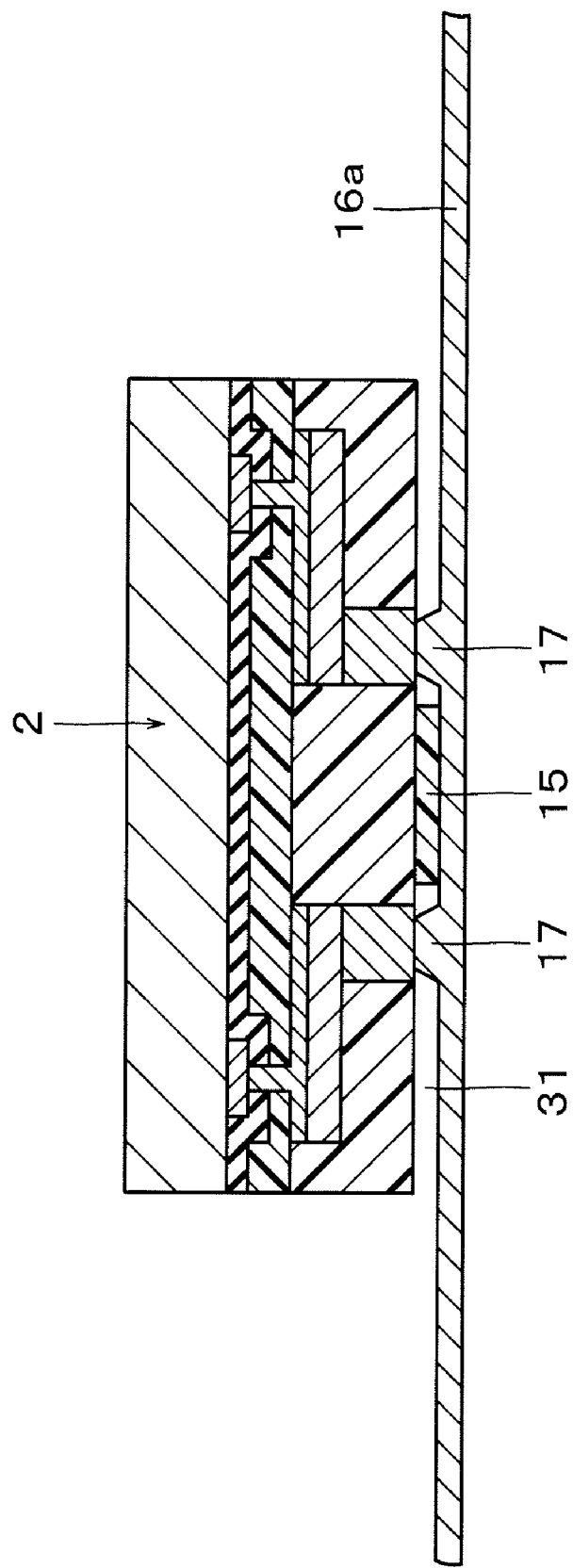
FIG. 3 is a cross-sectional view of a procedure subsequent to those in FIG. 2A to FIG. 2C.

Next, as shown in FIG. 3, the projection electrodes 17 on the metal plate 16a and the columnar electrodes 12 of the semiconductor construction 2 are aligned. The semiconductor construction 2 is then adhered to the adhesive material 15 by heat pressing using a heat pressing component (not shown). As a result, the semiconductor 2 is temporarily fixed to the metal plate 16a by the adhesive material 15 in a state where the columnar electrode 12 is mounted on each projection electrode 17 on the metal plate 16a. In this state, a gap 31 equal to the height of the projection electrode 17 is formed between the bottom surface of the semiconductor construction 2 and the top surface of the metal plate 16a.

Alignment described above between the projection electrodes 17 on the metal plate 16a and the columnar electrodes 12 of the semiconductor construction 2 is performed in each semiconductor device formation area of the metal plate 16a. In other words, when alignment of a single semiconductor construction 2 within a predetermined semiconductor device formation area is completed, alignment of another semiconductor construction 2 within another semiconductor device formation area is performed. Heat pressing for adhering the semiconductor construction 2 to the adhesive material 15 may be performed separately for each semiconductor construction 2. Alternatively, heat pressing may be performed simultaneously, after all semiconductor constructions 2 are aligned in the respective semiconductor device formation area, through use of a heat pressing plate of a size large enough to cover all semiconductor formation areas. Moreover, heating may be performed from the metal plate 16a side.

As described above, in the present invention, the metal plate 16a also serves as a base that holds each mounted semiconductor construction 2. This allows each semiconductor construction 2 to be individually positioned on the metal plate 16a, and ensures alignment between the columnar electrodes 12 of the semiconductor constructions 2 and the projection electrodes 17 on the metal plate 16a, thereby improving yield during the positioning procedure and the subsequent joining procedure.

Although not shown by a drawing, it is possible to perform alignment between the columnar electrodes 12 of the semiconductor construction 2 and the projection electrodes 17 on the metal plate 16a by reading alignment marks formed on the semiconductor constructions 2 and the metal plate 16a by a camera, and after suctioning the semiconductor construction 2 by a vacuum suctioning device, moving the semiconductor constructions 2 based on an X-Y table or the like. In the case where the suctioning section of the vacuum suctioning device has a heating function, it is possible to successively perform, after the alignment, the temporary fixing procedure in which the semiconductor construction 2 is heat pressed and adhered to the adhesive material 15.

Figure 4:
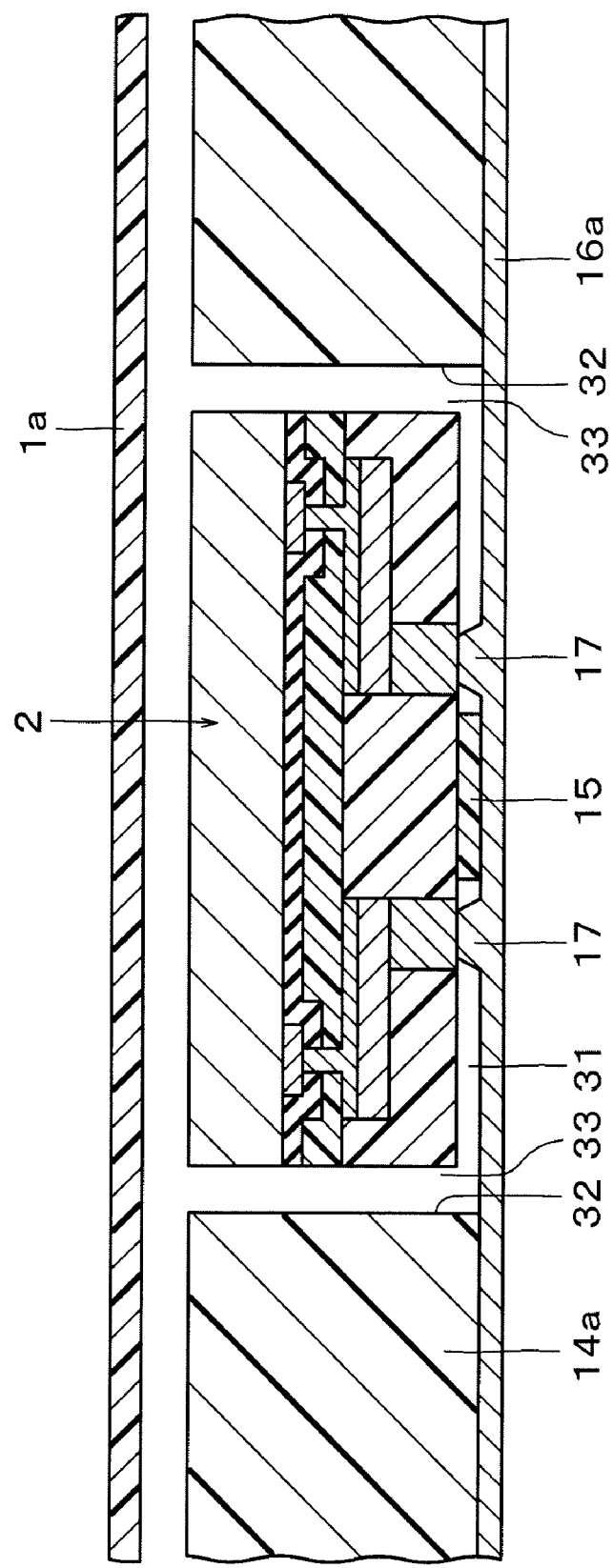
FIG. 4 is a cross-sectional view of a procedure subsequent to that in FIG. 3.

Next, as shown in FIG. 4, a insulating layer formation sheet 14a of lattice shape is positioned and arranged on the top surface of the metal plate 16a on the periphery of the semiconductor construction 2. To prevent the misalignment of the insulating layer formation sheet 14a, the peripheral edges of the insulating layer formation sheet 14a are preferably temporarily fixed to the metal plate 16a by an adhesive material (not shown). The insulating layer formation sheet 14a is formed by the impregnation of a base material made of glass fabric and the like with thermosetting resin such as epoxy system resin, and after semi-hardening the thermosetting resin to form a sheet shape, forming a plurality of rectangular openings 32 on the insulating layer formation sheet 14a by punching and the like.

Although the thickness of the insulating layer formation sheet 14a is not limited, the insulating layer formation sheet 14a is thicker than the thickness of the semiconductor construction 2 by an amount equal to the height of the projection electrodes 17 on the metal plate 16a. The top surface of the insulating layer formation sheet 14a is flush with the top surface of the semiconductor construction 2. However, the insulating layer formation sheet 14a may be slightly thicker than the total thickness of the thickness of the semiconductor construction 2 and the height of the projection electrodes 17 on the metal plate 16a. Moreover, the insulating layer formation sheet 14a may be formed by a plurality of sheets being stacked. The size of the openings 32 in the insulating layer formation sheet 14a is slightly larger than the size of the semiconductor construction 2. Therefore, a gap 33 is formed between the peripheral side surfaces of the insulating layer formation sheet 14a and the semiconductor construction 2.

Next, a lower-layer insulating film formation sheet 1a of sheet shape is placed on the top surface of the semiconductor construction 2 and the insulating layer formation sheet 14a. In this instance, the lower-layer insulating film formation sheet 1a is a so-called pre-preg material. For example, the lower-layer insulating film formation sheet 1a is glass fiber impregnated with epoxy system resin in which the epoxy system resin is in a semi-hardened state. To achieve flatness, the lower-layer insulating film formation sheet 1a is preferably sheet-shaped. However, the lower-layer insulating film formation sheet 1a is not necessarily limited to a pre-preg material. The lower-layer insulating film formation sheet 1a may be made of only thermosetting resin, such as epoxy system resin and polyimide system resin.

Figure 5:
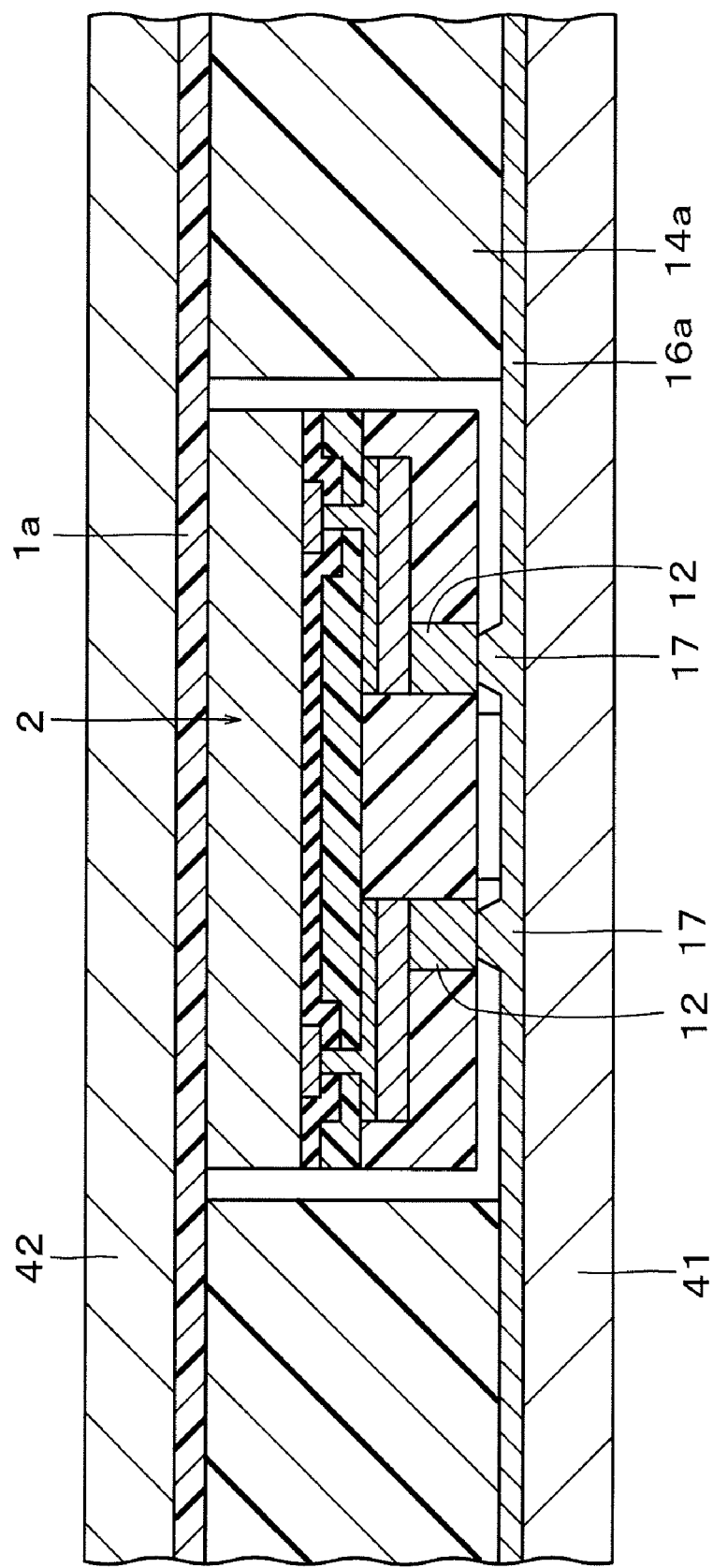
FIG. 5 is a cross-sectional view of a procedure subsequent to that in FIG. 4.

Next, as shown in FIG. 5, heat pressing plates 41 and 42 are pressed against the bottom surface of the metal plate 16a and the top surface of the lower-layer insulating film formation sheet 1a, and heat pressing is performed. As a result, the lower-layer insulating film formation sheet 1a and the insulating layer formation sheet 14a melt. Then, the lower-layer insulating film formation sheet 1a and the insulating layer formation sheet 14a merge, and organic resin included in the insulating layer formation sheet 14a fills the gap 33 between the insulating layer formation sheet 14a and the peripheral side surfaces of the semiconductor construction 2 and the gap 31 between the top surface of the metal plate 16a and the bottom surface of the semiconductor construction 2. When heating by the heat pressing plates 41 and 42 stop in this state, the lower-layer insulating film formation sheet 1a and the insulating layer formation sheet 14a harden, and after both components are joined, the semiconductor construction 2 is fixed onto the lower-layer insulating film formation sheet 1a. In addition, the organic resin pushed out of the insulating layer formation sheet 14a and filling the gaps 33 and 31 hardens, and as a result the insulating layer formation sheet 14a is fixed to the semiconductor construction 2, and the metal plate and the semiconductor construction 2 are fixed. Then, when the heat pressing plates 41 and 42 is moved, a semiconductor device assembly is obtained in which the semiconductor construction 2 is joined onto the projection electrodes 17 provided in each semiconductor device formation area of the metal plate 16a.

As described above, the projection electrode 17 integrally formed on the metal plate 16a is pressed to the columnar electrode 12 by the adhesive force of the organic resin filling the gap 31, and thus connection problems such as disconnection do not occur, and high connection reliability is achieved.

Figure 6:
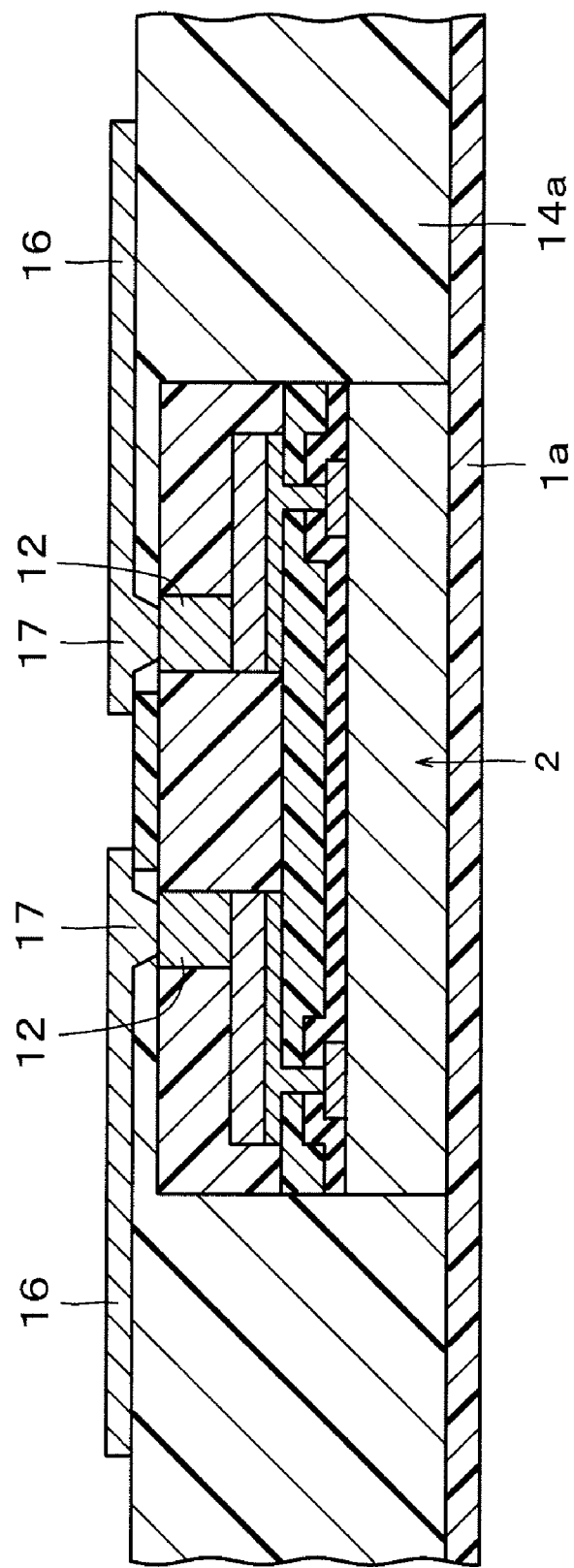
FIG. 6 is a cross-sectional view of a procedure subsequent to that in FIG. 5.

Next, when the upper layer wirings 16 are formed by the metal plate 16a being patterned through the use of the photolithography method, what shown in FIG. 6 is obtained in which each columnar electrode 12 of the semiconductor construction 2 and each projection electrode 17 of the upper layer wiring 16 are connected in each semiconductor formation area of the metal plate 16a.

Figure 7:
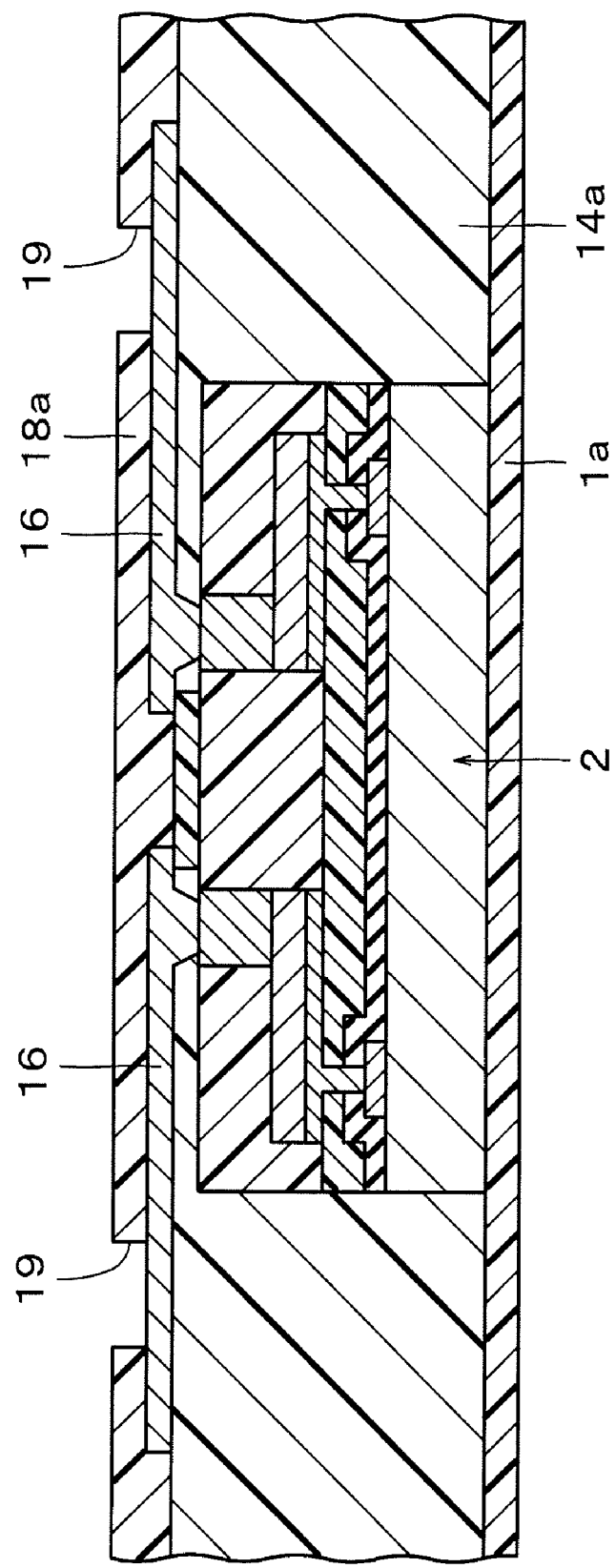
FIG. 7 is a cross-sectional view of a procedure subsequent to that in FIG. 6.
Figure 8:
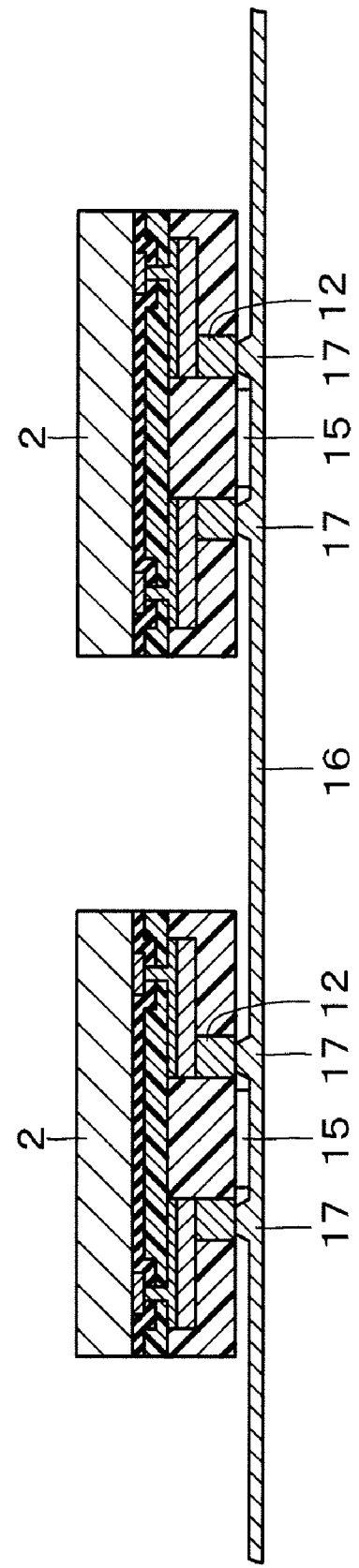
FIG. 8 is a cross-sectional view explaining the procedure in FIG. 3 in detail.

Next, as shown in FIG. 7, an upper-layer insulating film formation layer 18a made of solder resist is formed on the entire top surfaces of the upper-layer wirings 16 and the insulating layer formation sheet 14a by a screen printing method, a spin-coat method, and the like. In this instance, the openings 19 are formed in the upper-layer insulating film formation layer 18a in sections corresponding to the connection pad sections of the upper-layer wirings 16. Next, the solder balls 20 are formed within and above the openings 19 so as to be connected to the connection pad section of the upper-layer wiring 16.

Next, when the upper-layer insulating film formation layer 18a, the insulating layer formation sheet 14a, and the lower-layer insulating film formation sheet 1a are cut between adjacent semiconductor constructions 2, namely on the boundary lines between each semiconductor device formation area, a plurality of semiconductor devices shown in FIG. 1 are obtained.

As described above, the above-described manufacturing method is a method in which the metal plate 16a having a plurality of projection electrodes 17 in each of a plurality of semiconductor device formation areas is prepared, the external connection electrodes 12 of each semiconductor device are each mounted on the projection electrodes 17 in the semiconductor device formation areas, and both components are electrically connected. Accordingly, the above-described method differs from a conventional method in which a contact hole having a small area is formed on the upper-layer insulating film, and the upper layer wiring is subsequently formed by electroplating. Therefore, disconnection and uneven plating thickness do not occur during the connection procedure. As a result, connection between each projection electrode and each external connection electrode is ensured, and high reliability is gained. Moreover, unlike a method in which a large number of semiconductor constructions are arrayed on a base, and a metal plate on which projection electrodes are formed is heat pressed, accurate alignment between each projection electrode and each external connection electrode is performed, thereby improving yield.

Second Embodiment

Figure 9:
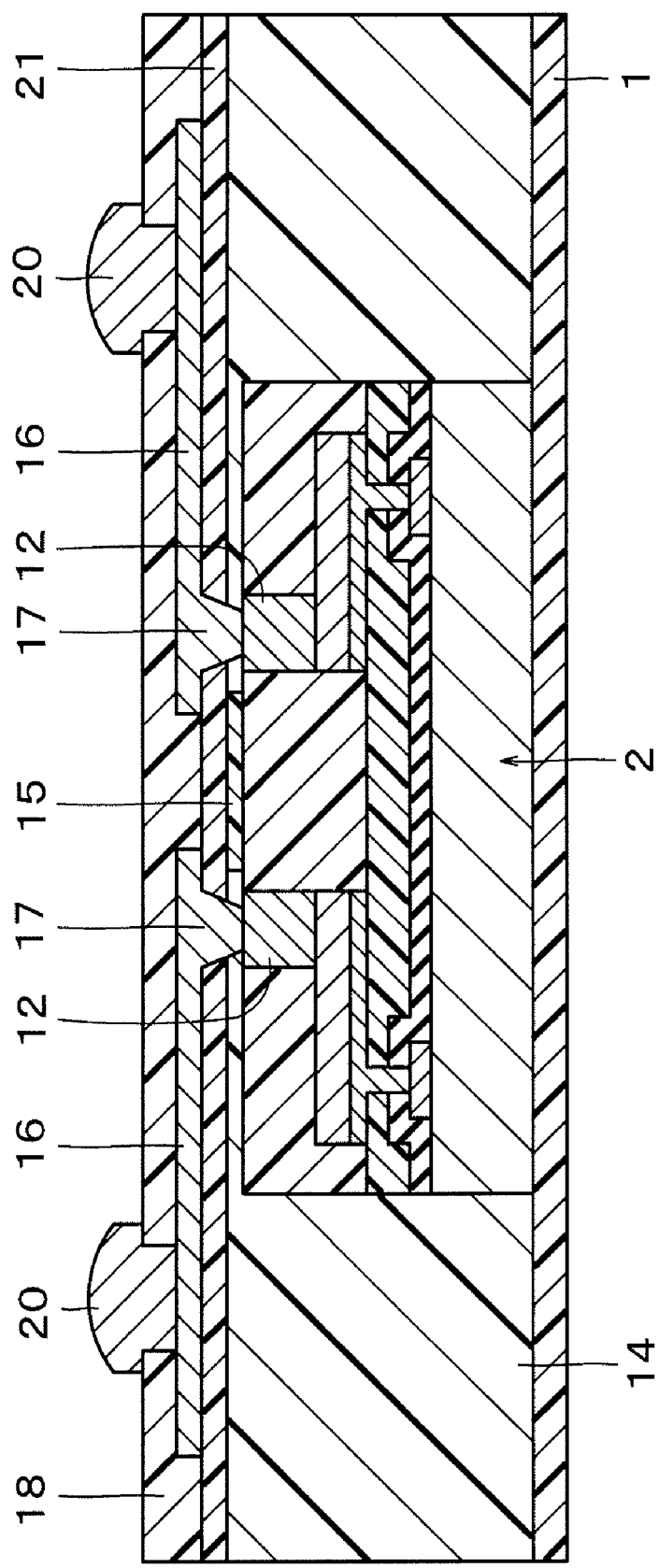
FIG. 9 is a cross-sectional view of a semiconductor device according to the second embodiment of the present invention.

FIG. 9 is an enlarged cross-sectional view of a semiconductor device according to the second embodiment of the present invention.

The semiconductor device according to the second embodiment differs from that according to the first embodiment in that a top-surface insulating film 21 is provided between the upper-layer wirings 16 and the insulating layer 14. The top-surface insulating film 21 is provided to reduce warping that occurs due to asymmetry in the thickness direction of the semiconductor device. The top-surface insulating film 21 is preferably made of the same material and has the same thickness as the lower-layer insulating film 1, but not limited thereto. Other components are similar to those according to the first embodiment, and components that are the same are given the same reference numbers. Explanations thereof are omitted.

Next, an example of a manufacturing method of the semiconductor device will be described.

First, in a manner similar to that according to the first embodiment, the metal plate 16a is etched, and the projection electrodes 17 are formed. Next, as shown in FIG. 10A, a top-surface insulating film formation layer 21a is formed on the top surface side of the metal plate 16a, namely on the surface on which the projection electrodes 17 are formed. The top-surface insulating film formation layer 21a is formed by screen printing, a coating method, transfer, and the like. Alternatively, a thermosetting resin or thermoplastic resin of sheet shape may be adhered. In this instance, openings are not required to be formed in areas corresponding to the projection electrodes 17. The organic resin adhered to the top surface of the projection electrodes 17 melts during a heat pressing procedure described hereafter, and merges with the top-surface insulating film formation layer 21a or the insulating layer formation sheet 14a.

Next, the adhesive material 15 is formed on the top-surface insulating film formation layer 21a such that the top surface of the adhesive material 15 projects slightly further than the top surfaces of the projection electrodes 17.

Next, the projection electrodes 17 on the metal plate 16a and the columnar electrodes 12 of the semiconductor construction 2 are aligned. Then, the semiconductor construction 2 is temporarily fixed to the adhesive material 15 by heat pressing by a heat pressing component.

In this state as well, the gap 31 equal to the height of the projection electrode 17 is formed between the bottom surface of the semiconductor construction 2 and the top surface of the metal plate 16a.

Next, the insulating layer formation sheet 14a of lattice shape is positioned and arranged on the top surface of the metal plate 16a on the periphery of the semiconductor construction 2. In this instance as well, the gap 33 is formed between the peripheral side surfaces of the insulating layer formation sheet 14a and the semiconductor construction 2.

Next, the lower-layer insulating film formation sheet 1a of sheet shape is placed on the top surfaces of the semiconductor construction 2 and the insulating layer formation sheet 14a. This state is shown in FIG. 10B.

Hereafter, in the same manner as that according to the first embodiment, heat pressing is performed from the bottom surface of the metal plate 16a and the top surface of the lower-layer insulating film formation sheet 1a. As a result, the lower-layer insulating film formation sheet 1a and the insulating layer formation sheet 14a melt. However, according to the second embodiment, the top-surface insulating film formation layer 21a also melts. Therefore, the lower-layer insulating film formation sheet 1a, the insulating layer formation sheet 14a, and the top-surface insulating film formation layer 21a merge. In addition, the gap 33 between the insulating layer formation sheet 14a and the peripheral side surfaces of the semiconductor construction 2 and the gap 31 between the top surface of the top-surface insulating film formation layer 21a and the bottom surface of the semiconductor construction 2 are filled with the organic resin that is a material included in both the insulating layer formation sheet 14a and the top-surface insulating film formation layer 21a.

When heating is stopped in this state, the lower-layer insulating film formation sheet 1a, the insulating layer formation sheet 14a, and the top-surface insulating film formation layer 21a harden and become integrated, and the semiconductor construction 2 is fixed onto the lower-layer insulating film formation sheet 1a. In addition, the organic resin pushed out of the top-surface insulating film formation layer 21a and the insulating layer formation sheet 14a and filling the gaps 33 and 31 harden. Then, the semiconductor construction 1 and the insulating layer formation sheet 14a are fixed by this organic resin and the top-surface insulating film formation layer 21a, and the metal plate 16a and the semiconductor construction 2 are fixed. In this manner, a semiconductor device assembly is obtained in which the semiconductor construction 2 is joined on to the projection electrodes provided in each semiconductor formation area of the metal plate 16a.

Next, in a manner similar to that shown in FIG. 6, the procedure for forming the upper wirings 16 by patterning the metal plate 16a by the photolithography method is performed. Then, in a manner similar to that shown in FIG. 7, the procedure for forming the upper-layer insulating film formation layer 18a made of solder resist, and the procedure for forming the solder balls 20 within and above the openings 19 on the upper-layer insulating film formation layer 18a so as to be connected to the connection pad sections of the upper wirings 16 are performed. When the upper-layer insulating film formation layer 18a, the top-surface insulating film formation layer 21a, the insulating layer formation sheet 14a, and the lower-layer insulating film formation sheet 1a are cut between adjacent semiconductor constructions 2, namely on the boundary lines between each semiconductor device formation area, a plurality of semiconductor devices shown in FIG. 9 are obtained.

According to the second embodiment as well, the metal plate 16a having a plurality of projection electrodes 17 in each of a plurality of semiconductor device formation areas is prepared, the external connection electrodes 12 of each semiconductor device are each mounted on the projection electrodes 17 in the semiconductor device formation areas, and both components are thereby electrically connected. Therefore, unlike the conventional method in which a contact hole having a small area is formed on the upper-layer insulating film, and the upper layer wiring is subsequently formed by electroplating, disconnection and uneven plating thickness do not occur during the connection procedure. Accordingly, connection between each projection electrode and each external connection electrode is ensured, and high reliability is gained. Moreover, unlike the method in which a large number of semiconductor constructions are arrayed on a base, and a metal plate on which projection electrodes are formed is heat pressed, accurate alignment between each projection electrode and each external connection electrode is performed, thereby improving yield. In addition, since the lower-layer insulating film 1 is provided on the bottom surface side of the insulating layer 14 and the top-surface insulating film 21 is provided on the top layer side, symmetry of the laminated structure of the insulating films is increased in the thickness direction. Therefore, an effect of reducing warping is achieved.

Variation Examples

The present invention is not limited to the above-described embodiments. Various modifications can be made and applied based on the basic concept indicated in the embodiments.

For example, the projection electrodes are formed by the etching of the metal plate. However, a method may be used in which projection electrodes formed from a mold are transferred onto the metal plate. Alternatively, the projection electrodes may be formed by a conductive paste being printed or potted onto the metal plate, or the like.

Moreover, the semiconductor construction includes the columnar electrodes and the sealing film. However, instead of the columnar electrodes, spherical or hemispherical projection electrodes may be provided, and the sealing film is not necessarily required. In other words, any semiconductor construction may be used as long as external connection electrodes are included.

Furthermore, when each semiconductor device is obtained by the cutting of the upper-layer insulating film formation layer 18a, the insulating layer formation sheet 14a, and the lower-layer insulating film formation sheet 1a on the boundary lines of each semiconductor device formation area, cutting may be performed such that a plurality of semiconductor constructions 2 are included in each semiconductor device.

While the present invention has been described with reference to the preferred embodiments, it is intended that the invention be not limited by any of the details of the description therein but includes all the embodiments which fall within the scope of the appended claims.

What is claimed is:

1. A manufacturing method of a semiconductor device, the method comprising:

preparing a metal plate having a plurality of projection electrodes in each of a plurality of semiconductor device formation areas;

providing an adhesive material that projects further than top surfaces of the projection electrodes in an area of each semiconductor device formation area of the metal plate in which the projection electrodes are not formed;

aligning the projection electrodes of each of the semiconductor formation areas to correspond to external connection electrodes of semiconductor constructions, and arranging each semiconductor construction separately on the projection electrodes in the semiconductor device formation areas;

arranging an insulating layer formation sheet on the metal plate, the insulating layer formation sheet having openings that accommodate the semiconductor constructions;

joining the metal plate and the insulating layer formation sheet by heat pressing the metal plate and the insulating layer formation sheet;

patterning the metal plate and forming a plurality of upper layer wirings that connect to at least one of the projection electrodes; and acquiring a plurality of semiconductor devices which contain at least one semiconductor construction by cutting the insulating layer formation sheet.

2. The manufacturing method of a semiconductor device according to claim 1, wherein joining the metal plate and the insulating layer formation sheet includes filling gaps between the metal plate and the semiconductor constructions with a material in the insulating layer formation sheet melted by the heat pressing.

3. The manufacturing method of a semiconductor device according to claim 1, further comprising:

arranging a lower-layer insulating film formation sheet that covers each semiconductor construction and the insulating layer formation sheet, after arranging the insulating layer formation sheet on the metal plate, and before joining the metal plate and the insulating layer formation sheet by heat pressing the metal plate and the insulating layer formation sheet.

4. The manufacturing method of a semiconductor device according to claim 3, wherein each of the projection electrodes on the metal plate is formed by etching the metal plate.

5. A manufacturing method of a semiconductor device, the method comprising:

preparing a metal plate having a plurality of projection electrodes in each of a plurality of semiconductor device formation areas;

forming a top-surface insulating film formation layer on a surface of the metal plate that is adapted to face semiconductor constructions;

providing an adhesive material for adhering the semiconductor constructions onto the top-surface insulating film formation layer;

aligning the projection electrodes of each of the semiconductor formation areas to correspond to external connection electrodes of the semiconductor constructions, and arranging each semiconductor construction separately on the projection electrodes in the semiconductor device formation areas;

arranging an insulating layer formation sheet on the metal plate, the insulating layer formation sheet having openings that accommodate the semiconductor constructions;

joining the metal plate and the insulating layer formation sheet by heat pressing the metal plate and the insulating layer formation sheet;

patterning the metal plate and forming a plurality of upper layer wirings that connect to at least one of the projection electrodes; and acquiring a plurality of semiconductor devices which contain at least one semiconductor construction by cutting the insulating layer formation sheet.

6. A manufacturing method of a semiconductor device, the method comprising:

preparing a metal plate having a plurality of projection electrodes in each of a plurality of semiconductor device formation areas;

aligning the projection electrodes of each of the semiconductor formation areas to correspond to external connection electrodes of semiconductor constructions, and arranging each semiconductor construction separately on the projection electrodes in the semiconductor device formation areas;

arranging an insulating layer formation sheet on the metal plate, the insulating layer formation sheet having openings that accommodate each semiconductor construction;

joining the metal plate and the insulating layer formation sheet by heat pressing the metal plate and the insulating layer formation sheet;

patterning the metal plate and forming a plurality of upper layer wirings that connect to at least one of the projection electrodes; and acquiring a plurality of semiconductor devices which contain at least one semiconductor construction by cutting the insulating layer formation sheet, wherein the insulating layer formation sheet is arranged such that a top surface of the insulating layer formation sheet is flush with a top surface of each semiconductor construction, and wherein a thickness of the insulating layer formation sheet is thicker than a thickness of each semiconductor construction by an amount equal to a height of the projection electrodes.

7. The manufacturing method of a semiconductor device according to claim 6, wherein the insulating layer formation sheet is formed from a plurality of sheets.

\* \* \* \* \*